US009418827B2

(12) United States Patent
Lee et al.

(10) Patent No.: US 9,418,827 B2
(45) Date of Patent: Aug. 16, 2016

(54) METHODS OF ION SOURCE FABRICATION

(71) Applicant: Hamilton Sundstrand Corporation, Charlotte, NC (US)

(72) Inventors: Wai Tak Lee, Rancho Cucamonga, CA (US); Richard K. Chun, Alhambra, CA (US)

(73) Assignee: Hamilton Sundstrand Corporation, Charlotte, NC (US)

(*) Notice: Subject to any disclaimer, the term of this patent is extended or adjusted under 35 U.S.C. 154(b) by 304 days.

(21) Appl. No.: 13/948,622

(22) Filed: Jul. 23, 2013

(65) Prior Publication Data

US 2015/0028221 A1    Jan. 29, 2015

(51) Int. Cl.
*H01J 37/08* (2006.01)
*H01J 49/10* (2006.01)
*H01J 27/02* (2006.01)
*B33Y 80/00* (2015.01)
*B33Y 10/00* (2015.01)
*H01J 37/065* (2006.01)

(52) U.S. Cl.
CPC ............. *H01J 49/10* (2013.01); *B33Y 10/00* (2014.12); *B33Y 80/00* (2014.12); *H01J 27/02* (2013.01); *H01J 37/08* (2013.01); *H01J 37/065* (2013.01); *H01J 2237/061* (2013.01)

(58) Field of Classification Search
CPC ... H01J 49/10; H01J 49/0013; H01J 49/0018; H01J 2237/03; H01J 2237/032; H01J 2237/036; H01J 2237/038; B29C 67/0066; B29C 67/0077; B29C 67/0051; B33Y 10/00; B33Y 80/00

See application file for complete search history.

(56) References Cited

U.S. PATENT DOCUMENTS

| | | | | | |
|---|---|---|---|---|---|
| 3,155,826 A | * | 11/1964 | Peters | ................. | G01M 3/202 250/299 |
| 3,296,481 A | * | 1/1967 | Peters | ................. | H01J 27/20 250/427 |
| 3,649,862 A | * | 3/1972 | Wahlin | ................. | G21K 1/08 250/427 |
| 3,770,954 A | * | 11/1973 | Davis | ................. | H01J 49/16 250/288 |
| 3,800,151 A | * | 3/1974 | Hull | ................. | H01J 49/32 250/283 |
| 4,721,878 A | * | 1/1988 | Hagiwara | ................. | H01J 27/022 313/336 |
| 5,477,046 A | * | 12/1995 | Dietrich | ................. | H01J 49/0013 250/288 |
| 6,022,258 A | * | 2/2000 | Abbott | ................. | H01J 27/04 445/49 |
| 6,608,431 B1 | * | 8/2003 | Kaufman | ................. | H01J 27/146 313/231.31 |
| 6,858,455 B2 | * | 2/2005 | Guillom | ................. | B82Y 10/00 438/20 |
| 6,926,313 B1 | * | 8/2005 | Renzi | ................. | B01J 19/0093 285/342 |
| 7,655,930 B2 | * | 2/2010 | Huang | ................. | H01J 27/08 250/423 R |

(Continued)

OTHER PUBLICATIONS

EOS, "Laser sintering system EOSINT M 280 . . ." Jun. 2013.*

(Continued)

*Primary Examiner* — Wyatt Stoffa
(74) *Attorney, Agent, or Firm* — Locke Lord LLP

(57) ABSTRACT

A method of ion source fabrication for a mass spectrometer includes simultaneously forming aligned component portions of an ion source using direct metal laser fusing of sequential layers. The method can further include forming the component portions on a base plate made from a ceramic material by applying fused powder to the base plate to build the component portions thereon.

2 Claims, 2 Drawing Sheets

(56) References Cited

U.S. PATENT DOCUMENTS

| | | | | |
|---|---|---|---|---|
| 7,682,970 | B2* | 3/2010 | Grigoropoulos | H01L 21/288 257/E21.582 |
| 7,973,278 | B2* | 7/2011 | Syms | G01N 27/62 250/281 |
| 8,907,273 | B1* | 12/2014 | Chen | H01J 49/062 250/289 |
| 2003/0122089 | A1* | 7/2003 | Murrell | H01J 37/3171 250/492.21 |
| 2004/0000647 | A1* | 1/2004 | Horsky | H01J 27/20 250/427 |
| 2004/0069994 | A1* | 4/2004 | Guillorn | B82Y 10/00 257/79 |
| 2004/0182818 | A1* | 9/2004 | Moon | G01N 30/6095 216/27 |
| 2004/0251410 | A1* | 12/2004 | Sainty | H01J 27/14 250/292 |
| 2006/0071161 | A1* | 4/2006 | Syms | H01J 49/4215 250/290 |
| 2008/0073600 | A1* | 3/2008 | Appleby | B29C 33/302 250/505.1 |
| 2008/0265173 | A1* | 10/2008 | Smith | H01J 9/14 250/396 R |
| 2009/0026361 | A1* | 1/2009 | Syms | H01J 3/14 250/281 |
| 2009/0261244 | A1* | 10/2009 | Syms | H01J 49/0018 250/288 |
| 2009/0295039 | A1* | 12/2009 | Fruth | B23K 26/16 264/401 |
| 2010/0276588 | A1* | 11/2010 | Syms | G01N 27/62 250/288 |
| 2011/0000986 | A1* | 1/2011 | Syms | H01J 49/0018 239/690 |
| 2011/0002109 | A1* | 1/2011 | Hauschild | B81C 3/008 361/809 |
| 2011/0267673 | A1* | 11/2011 | Agrawal | G02F 1/155 359/267 |
| 2011/0297841 | A1* | 12/2011 | Caporaso | H01J 37/04 250/396 ML |
| 2012/0126684 | A1* | 5/2012 | Kaga | H01J 27/26 313/361.1 |
| 2013/0120894 | A1* | 5/2013 | van Amerom | H01J 49/066 361/230 |
| 2013/0134855 | A1* | 5/2013 | Kellogg | H01J 37/04 313/39 |
| 2014/0054809 | A1* | 2/2014 | Lozano | H01J 37/08 264/28 |
| 2014/0061167 | A1* | 3/2014 | Stecker | B22F 3/1055 219/76.1 |
| 2014/0299766 | A1* | 10/2014 | Anderson | H01J 49/062 250/290 |
| 2014/0326872 | A1* | 11/2014 | Van Berkel | G01Q 30/14 250/288 |
| 2015/0076343 | A1* | 3/2015 | Tolmachev | H01J 49/062 250/290 |
| 2015/0212105 | A1* | 7/2015 | Obara | B01L 3/502715 73/64.56 |
| 2015/0318156 | A1* | 11/2015 | Loyd | H01J 49/068 250/287 |
| 2015/0318158 | A1* | 11/2015 | Pawliszyn | G01N 1/405 250/282 |

OTHER PUBLICATIONS

EOS, "Laser sintering system EOSINT M 280 for the production of tooling inserts, prototype parts and end products directly in metal" Jun. 2013.*

* cited by examiner

METHODS OF ION SOURCE FABRICATION

BACKGROUND OF THE INVENTION

1. Field of the Invention

The present invention relates to ion sources for mass spectrometers, and more particularly to methods of manufacturing ion sources.

2. Description of Related Art

Mass spectrometers are used for the chemical composition analyses of unknown gases or vapor samples. Generally, a mass spectrometer consists of three components: an ion source, a mass analyzer and a detector. The sample is introduced into and ionized in an ion source and the generated ions are separated by an analyzer according to their mass to charge ratio and subsequently detected by an ion detector. The atoms or molecules are then identified by correlating known masses to the identified masses or through a characteristic fragmentation pattern.

The ion source is an assembly made of precision machined electrodes and insulators. The electrodes and insulators are aligned and assembled carefully under a microscope. This makes the ion source a major cost of the instrument.

Such conventional methods and systems have generally been considered satisfactory for their intended purpose. However, there is still a need in the art for a more precise and simplified manufacturing method that allows for improved alignment with less cost. The present invention provides a solution for these problems.

SUMMARY OF THE INVENTION

A method of ion source fabrication for a mass spectrometer simultaneously forming aligned component portions of an ion source. The forming step can include using direct metal laser fusing of sequential layers. The method can further include forming the component portions on a base plate made from a ceramic material, for example by applying fused powder to the base plate to build the component portions thereon.

In another aspect of the disclosure, the method can include welding at least one component portion to the base plate. It is also contemplated that, the method can include coupling at least one component portion to the base plate using screws through a surface of the base plate opposite the component portion.

The method can also include forming a component portion including an ion focus. A component portion including an ion accelerator may also be fabricated using the method disclosed. One of the component portions can include an ion repeller. Additionally, a component portion including a block for filament holder may also be fabricated.

These and other features of the systems and methods of the subject invention will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION OF THE PREFERRED EMBODIMENTS

Figure 1:
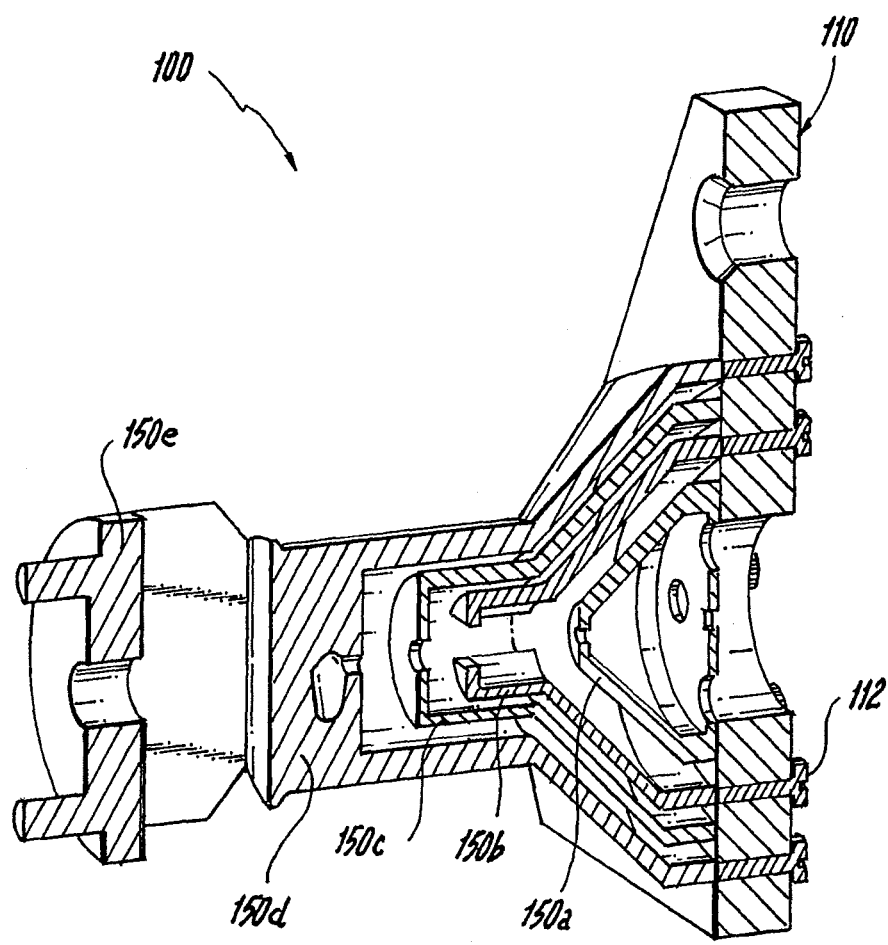
FIG. 1 is a cross-sectional perspective view of an ion source device of the present disclosure, showing component portions formed on a base plate.
Figure 2:
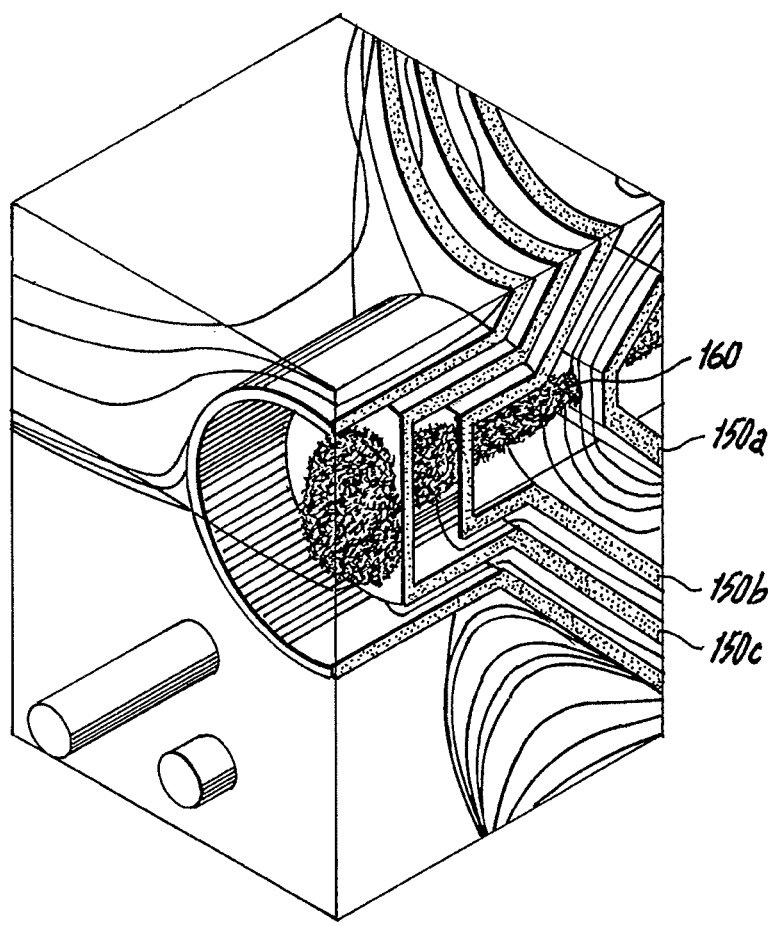
FIG. 2 illustrates a computer simulation of the ion trajectories within the ion source of FIG. 1.

Reference will now be made to the drawings wherein like reference numerals identify similar structural features or aspects of the subject disclosure. For purposes of explanation and illustration, and not limitation, a partial view of an exemplary embodiment of an ion source device in accordance with the disclosure is shown in FIG. 1 and is designated generally by reference character 100. Other embodiment of the ion source device, or aspects thereof, are shown in FIG. 2 as will be described. The systems and methods described herein can be used to fabricate an ion source for mass spectrometry.

Traditional ion sources used for mass spectrometry are machines components pieced together by hand underneath a microscope. The machined components are aligned underneath the microscope and then bolted together. This leads to very labor intensive and expensive manufacturing.

The present disclosure utilizes a recently developed commercial additive metal fabrication technology. For example, direct metal laser sintering (DMLS) is used to fabricate the ion source device 100. Since this technology builds metal electrodes layer by layer additively, the electrodes cannot be separated by insulators as in a conventional ion source.

FIG. 1 shows a cross-section view of component portions removed from within the ion source device 100. Direct metal laser sintering is used to fabricate an ion source device by forming the component portions simultaneously in an aligned state that can be used in mass spectrometry i.e., without the labor intensive manual alignment required in traditional ion sources. The process of fabricating an ion source 100 is started from a base plate 110 made from a ceramic material that supports all the electrodes or component portions 150a-e. The component portions 150a-e are formed or grown off of the base plate 110 by applying fused powder to the base plate 110 to build the component portions in additive layers. The metal electrodes or component portions are similar to those of a conventional ion sources therefore allowing for coupling with mass spectrometers for performing the identification of the molecules much as in traditional ion sources.

Once the component portions 150a-e are created from the base plate at least one component portion 150a-e may be welded to the base plate 110 to secure the structure thereon. Alternatively, screws 112 or the like may be used to connect at least one component portion 150a-e to the base plate 110.

In one embodiment a component portion such as an object silt 150a is formed from the base plate 110 with an ion focus 150b layered distally from the object silt 150a. An ion accelerator 150c may be formed over the ion focus 150b. An ion repeller 150d may be layered outboard of the ion accelerator 150c. A filament holder 150e is formed as the most remote component portion from the base plate 110. Those skilled in the art will recognize that additional and similar components may be fabricated to create an ion source suitable for specific applications. FIG. 2 shows a computer simulation illustrating stages of testing ion trajectories 160 using the ion source 100 of FIG. 1 fabricated by additive manufacturing.

The methods and systems of the present disclosure, as described above and shown in the drawings, provide for an ion source fabrication with superior properties including ease of manufacture. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A method of ion source fabrication for a mass spectrometer, comprising the steps of:
   additively forming aligned component portions of an ion source on a base plate made from a ceramic material, wherein the component portions are formed layer by layer such that a single layer includes at least two component portions;
   forming an object slit on the base plate;
   forming an ion focus surrounding the object slit;
   forming an ion accelerator over the ion focus;
   layering an ion repeller outboard of the ion accelerator; and
   forming a filament holder as the most remote component portion from the base plate.

2. The method of claim 1, wherein the step of forming aligned component portion further includes applying fused powder to the base plate to build the component portions thereon.

* * * * *